United States Patent
Xu et al.

(10) Patent No.: US 11,728,820 B2
(45) Date of Patent: Aug. 15, 2023

(54) HIGH-SPEED DIGITAL LOGIC CIRCUIT FOR SAR_ADC AND SAMPLING ADJUSTMENT METHOD

(71) Applicants: NO.24 RESEARCH INSTITUTE OF CHINA ELECTRONICS TECHNOLOGY GROUP CORPORATION, Chongqing (CN); Chongqing GigaChip Technology Co., Ltd., Chongqing (CN)

(72) Inventors: Daiguo Xu, Chongqing (CN); Hequan Jiang, Chongqing (CN); Xueliang Xu, Chongqing (CN); Jian'an Wang, Chongqing (CN); Guangbing Chen, Chongqing (CN); Dongbing Fu, Chongqing (CN); Yuxin Wang, Chongqing (CN); Xiaoquan Yu, Chongqing (CN); Shiliu Xu, Chongqing (CN); Tao Liu, Chongqing (CN)

(73) Assignees: NO.24 RESEARCH INSTITUTE OF CHINA ELECTRONICS TECHNOLOGY GROUP CORPORATION, Chongqing (CN); Chongqing GigaChip Technology Co., Ltd., Chongqing (CN)

( * ) Notice: Subject to any disclaimer, the term of this patent is extended or adjusted under 35 U.S.C. 154(b) by 78 days.

(21) Appl. No.: 17/279,101

(22) PCT Filed: Jan. 7, 2020

(86) PCT No.: PCT/CN2020/070594
§ 371 (c)(1),
(2) Date: Mar. 24, 2021

(87) PCT Pub. No.: WO2020/173225
PCT Pub. Date: Sep. 3, 2020

(65) Prior Publication Data
US 2021/0391870 A1    Dec. 16, 2021

(30) Foreign Application Priority Data

Feb. 26, 2019 (CN) .......................... 201910140900.9

(51) Int. Cl.
*H03M 1/44* (2006.01)
*H03M 1/12* (2006.01)
(Continued)

(52) U.S. Cl.
CPC ............ *H03M 1/44* (2013.01); *H03K 3/0233* (2013.01); *H03K 19/01728* (2013.01); *H03K 19/1774* (2013.01); *H03M 1/125* (2013.01)

(58) Field of Classification Search
CPC .... H03M 1/1245; H03M 1/125; H03M 1/442; H03M 1/44; H03K 19/1774; H03K 19/01728; H03K 3/0233
See application file for complete search history.

(56) References Cited

U.S. PATENT DOCUMENTS

2016/0112058 A1* 4/2016 Deguchi ............. H03M 1/0624
341/161
2016/0254821 A1 9/2016 Luo et al.

FOREIGN PATENT DOCUMENTS

CN          104242934 A    12/2014
CN          105141313 A    12/2015
(Continued)

*Primary Examiner* — Patrick C Chen

(57) ABSTRACT

The present disclosure belongs to the technical field of analog or digital-analog hybrid integrated circuits, and relates to a high-speed SAR_ADC digital logic circuit, in particular to a high-speed digital logic circuit for SAR_ADC and a sampling adjustment method. The digital logic circuit includes a comparator, a logic control unit parallel to the comparator, and a capacitor array DAC. The comparator and the logic control unit are simultaneously triggered by a clock signal. The comparator outputs a valid comparison result Dp/Dn, the logic control unit outputs a corresponding rising (Continued)

edge signal, the rising edge signal is slightly later than Dp/Dn output by the comparator through setting a delay match, Dp/Dn is captured by the corresponding rising edge signal, thereby settling a capacitor array. The present disclosure eliminates the disadvantage of the improper settling of the capacitor array of the traditional parallel digital logic.

5 Claims, 5 Drawing Sheets

(51) Int. Cl.
*H03K 3/0233* (2006.01)
*H03K 19/017* (2006.01)
*H03K 19/17736* (2020.01)

(56) References Cited

FOREIGN PATENT DOCUMENTS

| | | |
|---|---|---|
| CN | 109120263 A | 1/2019 |
| CN | 109687872 A | 4/2019 |

* cited by examiner

HIGH-SPEED DIGITAL LOGIC CIRCUIT FOR SAR_ADC AND SAMPLING ADJUSTMENT METHOD

CROSS REFERENCE TO RELATED APPLICATION

This is a Sect. 371 National Stage of PCT International Application No. PCT/CN2020/070594, filed on 7 Jan. 2020, which claims priority of a Chinese Patent Application No. CN2019101409009 filed on 26 Feb. 2019, the contents of which are incorporated herein by reference in its entirety for all purposes.

BACKGROUND

Field of Disclosure

The present disclosure relates to the technical field of analog or digital-analog hybrid integrated circuits, and relates to a high-speed SAR_ADC digital logic circuit, in particular, to a high-speed digital logic circuit for SAR_ADC and a sampling adjustment method.

Description of Related Arts

In recent years, with the improvement of the performances of analog-to-digital converters, especially with the continuous development of integrated circuit process technology, the research on high-speed asynchronous successive-approximation-register analog-to-digital converters (SAR_ADCs) is getting deeper. With the continuous evolution of integrated circuit manufacturing processes, the design of high-gain operational amplifiers has become more and more difficult. Because no operational amplifiers are required, SAR_ADCs have natural low power consumption advantages, especially at the nano-scale process node, the speed of SAR_ADCs has been greatly improved. Therefore, high-speed SAR_ADCs have become the research hotspots in analog-to-digital converters. In the traditional SAR_ADCs, due to the use of asynchronous logic, in each successive approximation process, after completing the comparison, the comparator transmits a trigger signal to trigger the digital logic. The digital logic controls the switching of switches in the capacitor array by obtaining the comparison result of the comparator, so that the voltage of the charge conservation plate in the capacitor array is successively approached. However, in the traditional structure, the comparison process of the comparator and the working process of the digital logic circuit are performed in series, and the delay is large. Therefore, the traditional structure is not conducive to the realization of high-speed SAR_ADCs.

The schematic view of the delay of the traditional SAR_ADCs is shown in FIG. 1, $T_{comp}$ represents the comparison delay of the comparator, $T_{reset}$ represents the reset delay of the comparator, $T_{logic}$ represents the digital logic delay, and $T_{dac}$ represents the settling delay of DAC. As can be seen from FIG. 1, in the traditional SAR_ADC digital logic circuit, the delay of a successive approximation cycle can be approximately expressed as $T_{comp}+T_{logic}+T_{dac}$. Taking a 10-bit SAR_ADC as an example, the total delay is 10 ($T_{comp}+T_{logic}+T_{dac}$).

Overall, the above three delay times are roughly the same. If the delay time of one of $T_{comp}$, $T_{logic}$, and $T_{dac}$ can be reduced, the total delay time can be greatly reduced, which is very important for improving the overall speed of the SAR_ADC. According to the knowledge of circuits, the reset delay $T_{reset}$ of the comparator and the comparison delay $T_{comp}$ of the comparator are approximately the same. Referring to FIG. 1, the reset delay ($T_{logic}+T_{dac}$) of the comparator is significantly longer than the comparison delay $T_{comp}$ of the comparator, the reset delay of the comparator does not need such a long time, but the comparator must wait for the delay of $T_{logic}+T_{dac}$ before making the next comparison.

In response to the above problems, a parallel SAR logic technology has been proposed. The schematic view of the delay of SAR_ADC is shown in FIG. 2. Comparator comp and SAR logic are simultaneously triggered by signal Clk. By reasonably setting the delays of comparator comp and SAR logic, the delay $T_{comp}$ of the comparator and the delay $T_{logic}$ of SAR logic are roughly equivalent. In each comparison cycle, the valid output signal of the comparator comp is Dp/Dn, the SAR logic outputs logic window. In each comparison cycle, the corresponding logic window captures the corresponding valid output result Dp/Dn of the comparator, and then the capacitor array starts to be settled. Through this parallel SAR logic technology, the comparator comp and SAR logic are triggered at the same time. By reasonably setting the delay of the comparator comp and SAR logic, the valid output result Dp/Dn of the comparator can be captured by the logic window output by the SAR logic, thereby triggering the settling of the capacitor array. Through the above technology, the delay time of the entire SAR_ADC becomes $T_{comp}+T_{dac}$, which greatly reduces the delay time of SAR_ADC and significantly improves the conversion speed of SAR_ADC.

In actual work, in order to quickly capture the valid output signal Dp/Dn of the comparator comp, the delay of the logic window output by SAR logic will be slightly smaller than the comparison delay of the comparator comp, so that as long as the valid comparison result of the comparator is output, it will be immediately captured by the logic window.

The disadvantage of the above structure is that when the SAR logic outputs the logic window and the comparator does not output a valid comparator result, the logic window will capture an invalid comparison result, resulting in improper settling of DAC when the capacitor array starts to be settled. When the comparator comp outputs a valid comparison result, the capacitor array will turn to proper settling, this phenomenon will reduce the accuracy of the settling of the capacitor array, thus affecting the entire SAR_ADC precision. On the other hand, as the working speed of SAR_ADC increases, it becomes more and more difficult to generate a high-speed logic window. The design purpose of capturing the valid result of the comparator through the logic window cannot be fully reflected. At the same time, there is still a problem of the asynchronous SAR logic structure. With the change of the input signal, power supply voltage, temperature and process angle, the time required for the SAR_ADC to complete the entire successive approximation process varies. To ensure that the SAR_ADC samples the input signal after completing the entire successive approximation process, the sampling of SAR_ADC must meet the slowest conversion time. SAR_ADC needs to wait for a period of time to sample after completing the entire successive approximation process in most cases, which will cause a waste of time and limit the conversion speed of SAR_ADC.

Since the sampling that needs to satisfy SAR_ADC must meet the slowest conversion time, the sampling time is significantly compressed, thereby reducing the sampling accuracy of SAR_ADC. In order to obtain higher sampling accuracy, in the design, it is necessary to increase the sampling switch size, reduce the DAC area, or reduce the SAR_ADC conversion speed. The above methods will significantly increase the design cost or introduce other non-ideal factors, and increase the circuit design difficulty.

SUMMARY

The present disclosure provides a high-speed digital logic circuit for SAR_ADC and a sampling adjustment method. The principle of parallel digital logic is still used. The comparison process of the comparator and the digital logic module start to work at the same time. Through delay matching, the two delays are basically the same. The output signal of the digital logic module sequentially captures the comparison result of the comparator, thereby significantly reducing the delay of a complete working process of the SAR_ADC and increasing the working speed of the SAR_ADC.

The present disclosure further provides a high-speed digital logic circuit for SAR_ADC, which includes a comparator, a logic control unit parallel to the comparator, and a capacitor array DAC; the comparator and the logic control unit are simultaneously triggered by a clock signal Clk; the comparator outputs a valid comparison result Dp/Dn, the logic control unit outputs a corresponding rising edge signal C<i>, the rising edge signal C<i> output by the logic control unit is slightly later than the valid comparison result Dp/Dn output by the comparator through setting a delay match, Dp/Dn is captured by the corresponding rising edge signal C<i>, thereby settling a capacitor array; i=0, 1, ..., N−1, N represents a number of bits of SAR_ADC.

Further, the logic control unit includes an OR gate and N+1 D flip-flops connected in series, and the D flip-flop includes an AND gate, a pull-up PMOS transistor, a transmission gate and a plurality of inverters; a data signal D<i> enters the transmission gate from a data input end and is transmitted to a first inverter, a reset signal R<i> reverses a signal output from the first inverter at a reset signal input end, and a data signal Q<i> is output through a data output end of a second inverter; the reset signal R<i> and CP<i> in a clock signal Clk at a clock input end CP are output from a third inverter through the AND gate.

Further, when the reset signal R<i> input from the reset signal input end is 0, the data signal Q<i> output from the data output end of the D flip-flop is reset to 0; when the reset signal R<i> of the reset signal input end is 1, and the clock signal CP<i> of the clock signal input end is 1, the data signal Q<i> output from the data output end of the D flip-flop is refreshed to the data signal D<i> input from the data input end of the D flip-flop; when the reset signal R<i> of the D flip-flop is 0, the clock signal CP<i> of the comparator is not 1.

Further, the reset signal input end is controlled by an inverted signal Clks_inn of an internal sampling control signal Clks_in; the internal sampling control signal Clks_in includes an output signal of the OR gate by inputting an output signal of the N+1th D flip-flop and an external sampling control signal into the OR gate.

Under the high-speed logic digital circuit of the present disclosure, the present disclosure further provides a sampling adjustment method of the high-speed digital logic circuit for SAR_ADC. The method includes: after N successive approximation processes are completed, an external sampling control signal Clks is still 0, and an output signal generated by the N+1th D flip-flop becomes 1, which makes an output signal of the OR gate become 1, so that the SAR_ADC immediately enters a sampling state, and the first N D flip-flops are reset at the same time; after the external sampling control signal Clks changes from 0 to 1, the N+1th D flip-flop is reset, the output signal of the N+1th D flip-flop becomes 0, the output signal of the OR gate remains at 1, the SAR_ADC is still in the sampling state until the external sampling control signal becomes 0, the sampling state ends, and the SAR_ADC enters a successive approximation state.

The present disclosure has the following beneficial effects:

Compared with the traditional parallel SAR logic technology, in the present disclosure, the valid output result Dp/Dn of the comparator is captured by the digital signal rising edges respectively output by the SAR logic. The present disclosure eliminates the disadvantage of the improper settling of the capacitor array of the traditional parallel digital logic, which uses a digital logic window to capture the valid output result Dp/Dn of the comparator. At the same time, the digital signal rising edge captures the valid output result Dp/Dn of the comparator, which is more suitable for high-speed situations than generating a logic window.

On the other hand, the present disclosure adopts sampling adjustment technology. Compared with the traditional technology, when the asynchronous logic is adopted, the sampling time of SAR_ADC can be increased to the greatest extent, and the sampling accuracy of SAR_ADC is improved without introducing additional complicated circuits.

DETAILED DESCRIPTION OF THE PREFERRED EMBODIMENTS

In order to make the objectives, technical solutions and advantages of the present disclosure clearer, the technical solutions in the embodiments of the present disclosure will be described clearly and completely below with reference to the drawings. The described embodiments are only a part of the embodiments of the present disclosure, and will not be limited.

Embodiment 1

Figure 1:
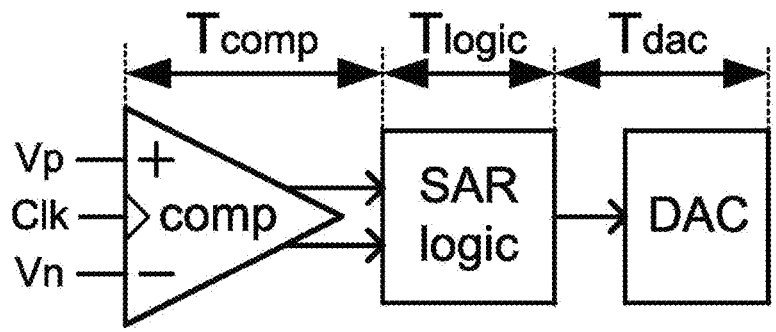
FIG. 1 is a schematic view of the delay of a traditional SAR_ADC.
Figure 2:
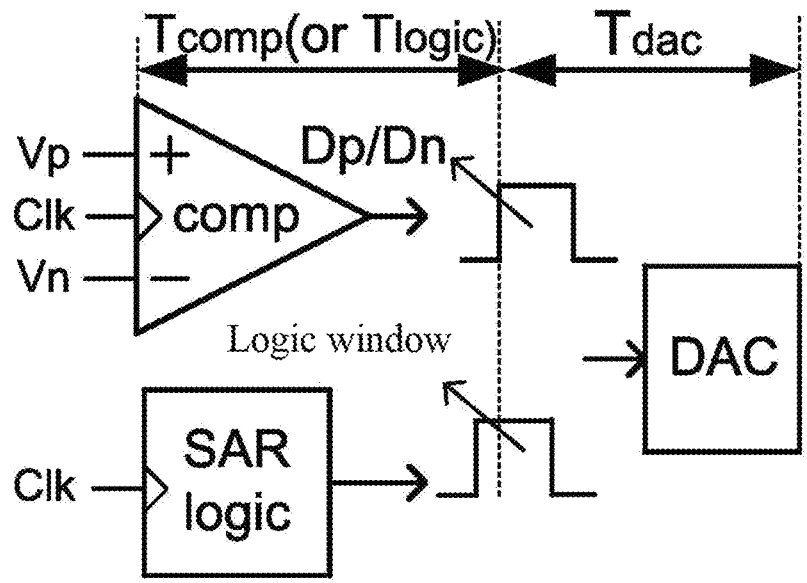
FIG. 2 is a schematic view of the delay using parallel SAR logic technology.
Figure 3:
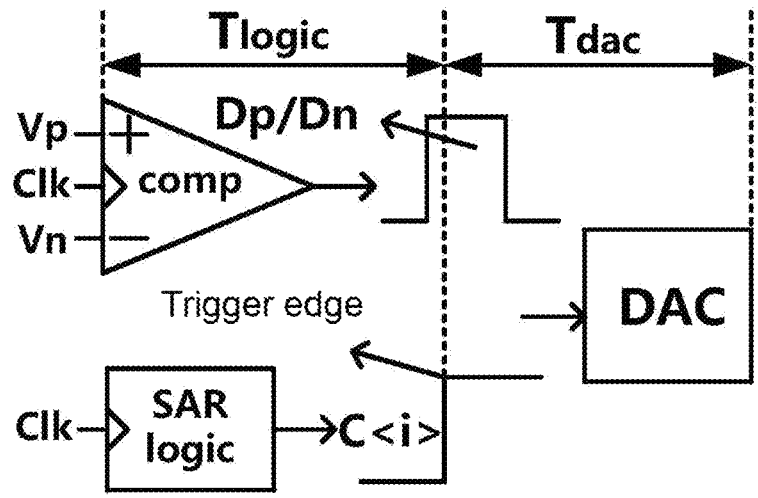
FIG. 3 is a schematic view of parallel SAR logic used in the present disclosure.

This embodiment uses a 10-bit SAR_ADC as an example for description, that is, N=10. The schematic view of parallel SAR logic used in the present disclosure is shown in FIG. 3. The comparator comp and the logic control unit SAR logic are simultaneously triggered by the signal Clk. After a delay, the comparator outputs a valid comparison result Dp/Dn, and the SAR logic outputs the corresponding rising edge signal C<i> (i=0, 1, . . . , 9). By setting an appropriate delay, the rising edge signal C<i> (i=0, 1, . . . , 9) output by SAR logic is slightly later than the valid comparison result Dp/Dn output by the comparator, so that Dp/Dn is captured by the corresponding rising edge signal C<i> (i=0, 1, . . . , 9).

Figure 4:
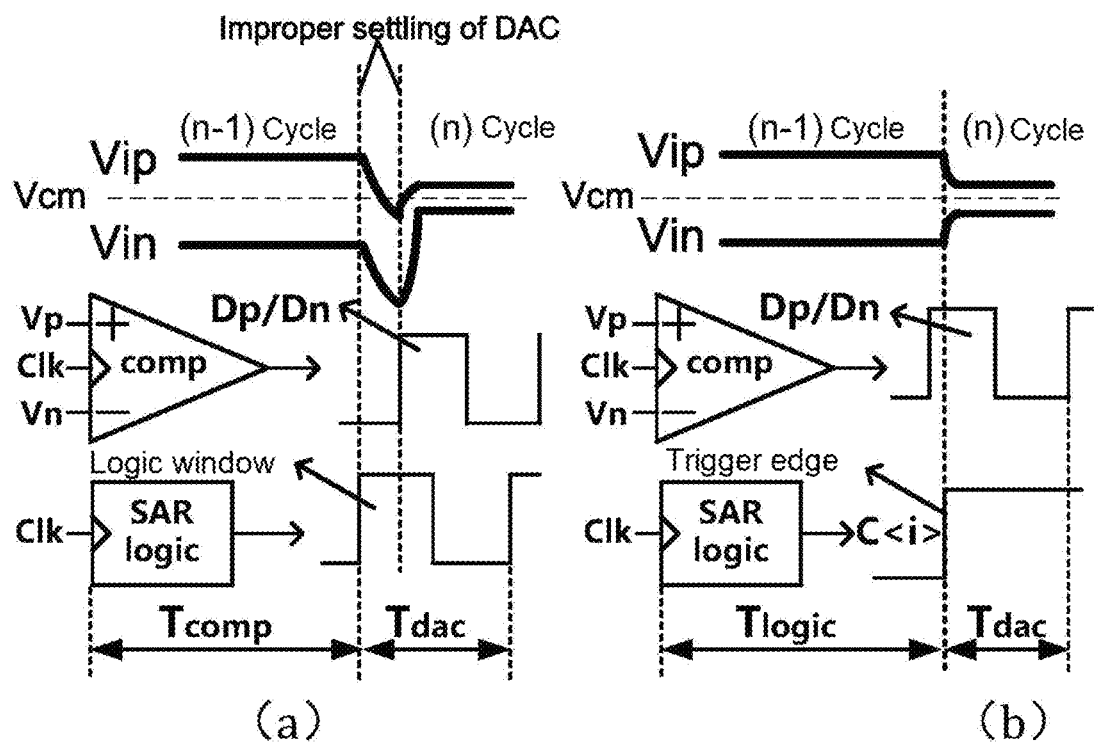
FIG. 4 is a comparison view of DAC settling of two parallel SAR logic structures, (a) indicates prior art, (b) indicates the present disclosure.

In the present disclosure, since the rising edge signal C<i> (i=0, 1, . . . , 9) is later than the valid comparison result Dp/Dn output by the comparator, it will not cause the improper settling of the capacitor array, thereby improving the settling accuracy of the capacitor array. A comparison view of settling two parallel SAR logic structure DACs is shown in FIG. 4. The view of settling the traditional parallel SAR logic structure DAC is shown in FIG. 4(a). As can be seen from FIG. 4(a), the capacitor array DAC will have an improper settling of DAC between the rising edge of the logic window and the valid comparison result Dp/Dn of the comparator. After the comparator outputs a valid result, the capacitor array DAC starts to be settled normally. The above process will reduce the settling accuracy of the capacitor array or increase the settling time of the DAC.

The settling of the parallel SAR logic structure DAC of the present disclosure is shown in FIG. 4(b). Because the rising edge signal C<i> (i=0, 1, . . . , 9) output by the SAR logic has a delay time slightly longer than Dp/Dn, the capacitor array DAC will be built normally.

Figure 5:
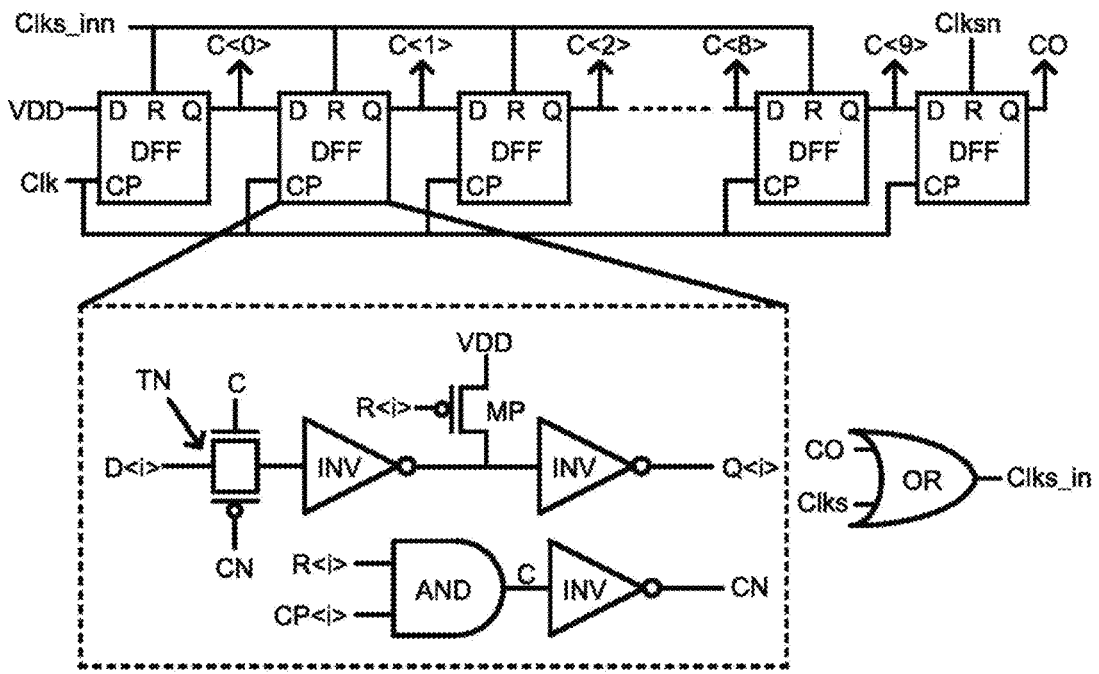
FIG. 5 is a schematic view of the SAR logic of the SAR_ADC according to the present disclosure.
Figure 6:
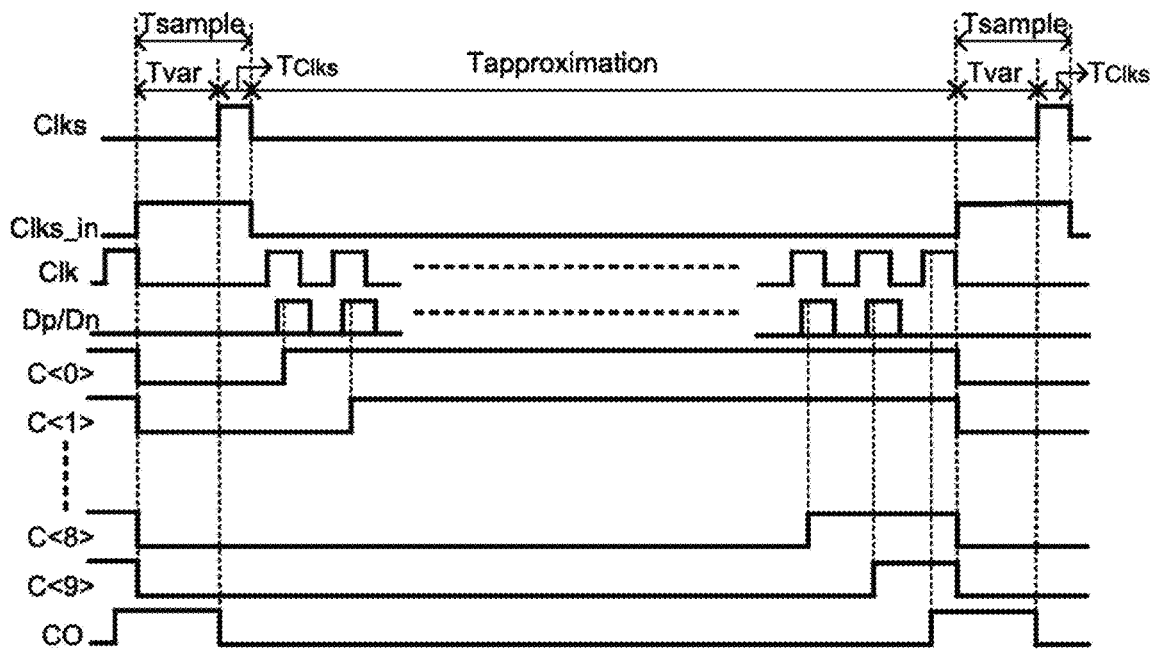
FIG. 6 is a work timing view according to the present disclosure.

The principle view and working timing view of the SAR logic of the present disclosure are shown in FIGS. 5 and 6, respectively. In FIG. 5, the logic control unit includes an OR gate and N+1 D flip-flops connected in series. For the D flip-flop DFF, the D end is the data input end, the CP end is the clock input end, the R end is the reset signal input end, and the Q end is the data output end of.

When the input signal of the reset signal input end R is 0, the data output end Q of the DFF is reset to 1. When the input signal of the reset end R is 1, and the input signal of the clock signal input end CP is 1, the output data of the data output end Q of DFF is refreshed as the input signal of the data input end D of DFF.

The signal Clks is an external sampling control signal, the signal Clks_in is an internal sampling control signal, and the signals Clks_inn and Clksn are the inverted signals of Clks_in and Clksn, respectively. The output signal CO of the 11th D flip-flop and the external sampling control signal Clks are input to the OR gate, and the output signal of the OR gate is the internal sampling control signal Clks_in.

As a possible embodiment, as shown in FIG. 5, the D flip-flop DFF in the present disclosure includes an inverter INV, an AND gate, a pull-up PMOS transistor MP, and a transmission gate TN. The data signal D<i> enters the transmission gate from the data input end and is transmitted to the first inverter. The reset signal R<i> reverses the signal output from the first inverter at the reset signal input end, and the data signal Q<i> is output through the data output end of the second inverter. The reset signal R<i> and CP<i> in the clock signal Clk at the clock input end CP are output from the third inverter through the AND gate.

In FIG. 6, the comparator and SAR logic are simultaneously triggered by the signal Clk, the valid output signal of the comparator is Dp/Dn, and the output signal of the SAR logic is C<i> (i=0, 1, . . . , 9).

Through delay matching, that is, setting the circuit delay (10%-20% of a comparator clock cycle), so that the rising edge of the output signal C<i> (i=0, 1, . . . , 9) of SAR logic is slightly later than the valid output result Dp/Dn of the comparator, then the valid output result Dp/Dn of the comparator can be sequentially captured by the output signal C<i> (i=0, 1, . . . , 9) of SAR logic.

Through this solution, the settling error of the capacitor array in the traditional parallel SAR logic technology can be significantly reduced, and the accuracy of the SAR_ADC can be improved. Since the traditional structure captures the valid output result Dp/Dn of the comparator by using a digital logic window, as the SAR_ADC conversion speed increases, it is more difficult to generate a high-speed logic window. The logic rising edge C<i> (i=0, 1, . . . , 9) proposed by the present disclosure captures the output result of the comparator, which can effectively avoid the design difficulty caused by the high-speed logic window.

On the other hand, for SAR_ADC, as the parameters such as temperature, power supply voltage and process angle change, the time required to complete the successive approximation is different, and the sampling process has to be performed after the successive approximation process is completed. Therefore, it is necessary to wait for a period of time after the completion of the successive approximation process when designing the circuit before starting the next sampling process. The waiting time is different under different temperatures, power supply voltages and process corners. In the design, this waiting time must be designed to be the longest waiting time in various situations to meet the requirements of all situations. This makes a waste of time in some cases.

Embodiment 2

The present disclosure further proposes a sampling time adjustment method, that is, a sampling adjustment method of a high-speed digital logic circuit for SAR_ADC. After 10 times successive approximation processes are completed, the external sampling control signal Clks is still 0, and the output signal CO generated by the 11th D flip-flop becomes 1, which makes the output of the OR gate change from Clks_in to 1, so that the SAR_ADC immediately enters the sampling state, and at the same time, the first 10 D flip-flops are reset. After the external sampling control signal Clks changes from 0 to 1, the 11th D flip-flop is reset and its output signal CO becomes 0. Because the external sampling control signal Clks is 1 at this time, and the output signal Clks_in of the OR gate remains at 1, so that the SAR_ADC is still in the sampling state until the external sampling control signal Clks becomes 0, the sampling state ends, and the SAR_ADC enters the successive approximation state.

As can be seen from the above description, the total sampling time $T_{sample}$ of SAR_ADC includes a fixed time $T_{Clks}$ and a variable time $T_{var}$. $T_{Clks}$ is determined by the external sampling control signal Clks, which is a fixed value. $T_{var}$ is determined by the internal conversion time, which varies with temperature, power supply voltage, and process angle. The present disclosure can make the SAR_ADC start sampling once the successive approximation process is completed under the conditions of temperature, power supply voltage and process angle change. Compared with the fixed sampling time of the traditional SAR_ADC, the sampling time is extended to the greatest extent, and the performances of SAR_ADC are improved.

Embodiment 3

Figure 7:
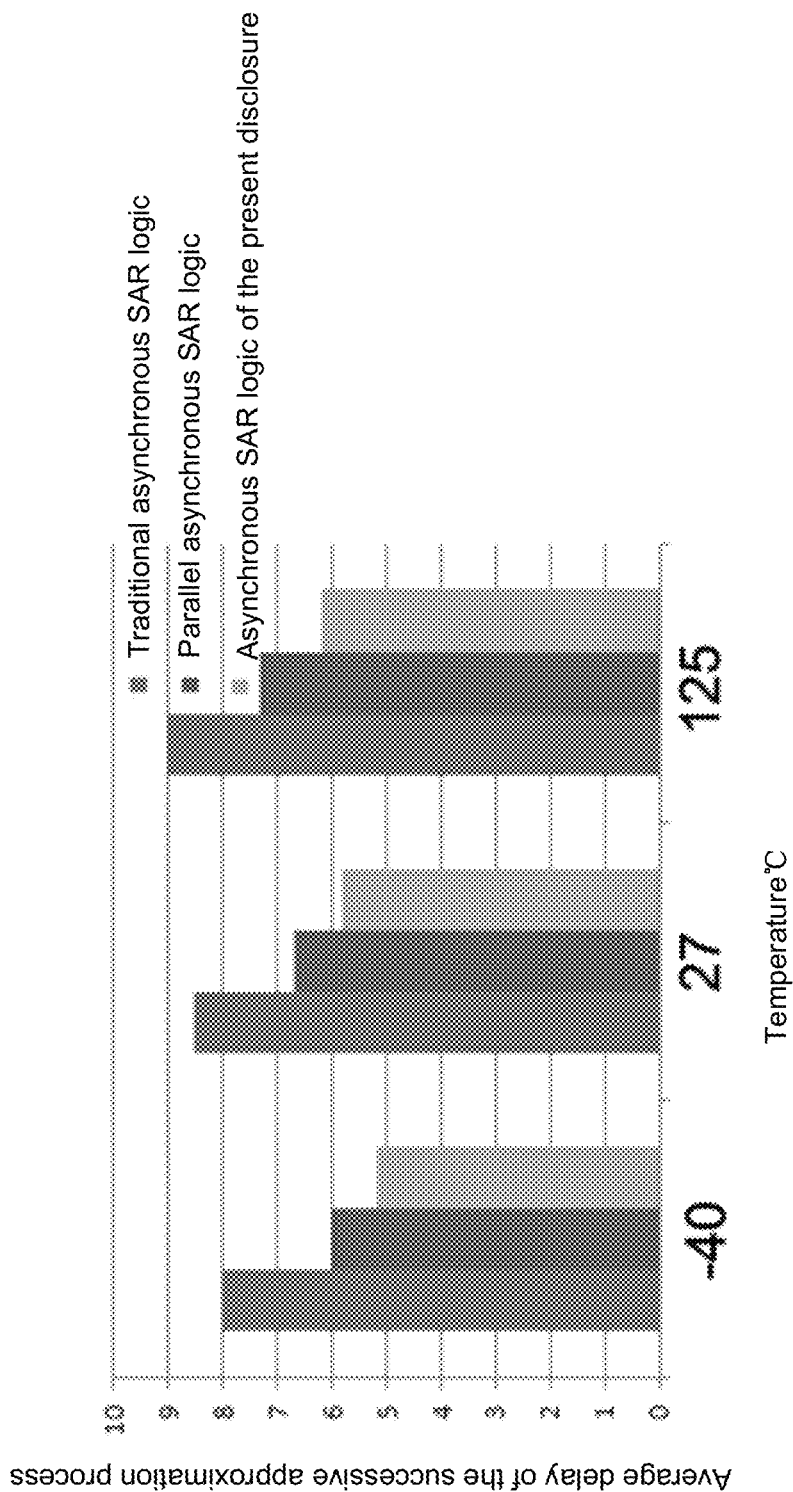
FIG. 7 is a comparison view of the average delay of the successive approximation process of three structures.
Figure 8:
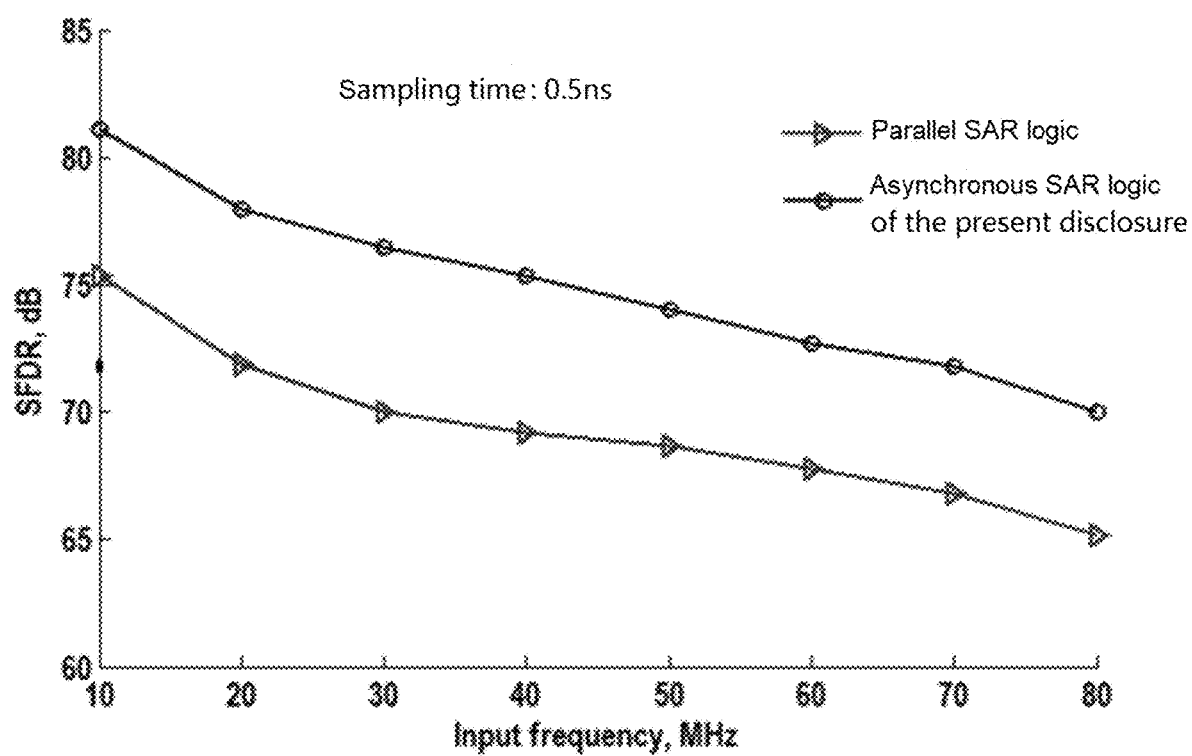
FIG. 8 is a sampling signal linearity comparison view.

In order to further verify the above advantages of the present disclosure, under the 65 nm CMOS process, the above structure is carefully designed, and the power supply voltage is 1.2V. The above three structures (including traditional asynchronous SAR logic, traditional parallel asynchronous SAR logic and SAR logic proposed by the present disclosure) are adopted to respectively design a 10-bit SAR_ADC with a sampling rate of 100 MHz. The conversion time and sampling time of the above three structures are compared through the simulation results. The external sampling times of the three structures are set to 1 ns, and the average delay comparison view of the successive approximation process of the three structures is shown in FIG. 7. As can be seen from FIG. 7, compared with the traditional asynchronous SAR logic, the present disclosure improves the speed by at least 37.5%. Compared with parallel asynchronous SAR logic, because the parallel asynchronous SAR logic requires a longer delay to recover the improper settling of DAC, the present disclosure improves the speed by at least 17%. Since the sampling times of the traditional asynchronous SAR logic and parallel SAR logic structures are the same, only the sampling effects of the parallel SAR logic structure and the SAR logic structure of the present disclosure are compared. When the sampling time is set to 0.5 ns, the sampling signal linearity comparison view of the parallel SAR logic structure and the SAR logic structure of the present disclosure is shown in FIG. 8. Since the sampling time is reduced from 1 ns to 0.5 ns, for the parallel SAR logic structure, the sampling time is only 0.5 ns. For the SAR logic structure of the present disclosure, the variable sampling time $T_{var}$ in FIG. 5 can increase the sampling time of the SAR_ADC, thereby increasing the sampling accuracy of the SAR_ADC. Therefore, as can be seen from FIG. 8, after adopting this technique, as the input signal amplitude changes, the spurious-free dynamic range (SFDR) of the signal obtained by sampling is increased by 6 dB on average.

The above-mentioned embodiments further describe the purpose, technical solutions and advantages of the present disclosure in detail. It should be understood that the above-mentioned embodiments are only preferred embodiments of the present disclosure and are not intended to limit the present disclosure. Any modification, equivalent replacement, improvement, etc. made to the present disclosure within the principle of the present disclosure should be included in the protection scope of the present disclosure.

We claim:

1. A high-speed digital logic circuit for successive-approximation-register analog-to-digital converter (SAR_ADC), comprising a comparator, a logic control unit parallel to the comparator, and a capacitor array digital-to-analog converter (DAC); wherein the comparator and the logic control unit are simultaneously triggered by a clock signal Clk; the comparator outputs a valid comparison result Dp/Dn, the logic control unit outputs a corresponding rising edge signal C<i>, the corresponding rising edge signal C<i> output by the logic control unit is slightly later than the valid comparison result Dp/Dn output by the comparator through setting a delay match, the valid comparison result Dp/Dn is captured by the corresponding rising edge signal C<i>, thereby settling a capacitor array; i=0, 1, . . . , N−1, N represents a number of bits of SAR_ADC, wherein the logic control unit comprises an OR gate and N+1 D flip-flops connected in series, and each D flip-flop comprises an AND gate, a pull-up PMOS transistor, a transmission gate and a plurality of inverters; a data signal D<i> enters the transmission gate from a data input end and is transmitted to a first inverter, a reset signal R<i> reverses a signal output from the first inverter at a reset signal input end, and a data signal Q<i> is output through a data output end of a second inverter; the reset signal R<i> and CP<i> in a clock signal Clk at a clock input end CP are output from a third inverter through the AND gate.

2. The high-speed digital logic circuit for SAR_ADC according to claim 1, wherein when the reset signal R<i> input from the reset signal input end and the clock signal CP<i> are both 0, the data signal Q<i> output from the data output end of the D flip-flop is reset to 0; when the reset signal R<i> of the reset signal input end is 1, and the clock signal CP<i> of the clock signal input end is 1, the data signal Q<i> output from the data output end of the D flip-flop is refreshed to the data signal D<i> input from the data input end of the D flip-flop; when the reset signal R<i> of the D flip-flop is 1, and the clock signal CP<i> is 0, the data signal Q<i> output from the data output end of the D flip-flop maintains a value of the previous state; when the reset signal R<i> of the D flip-flop is 0, the clock signal CP<i> of the comparator is not 1.

3. The high-speed digital logic circuit for SAR_ADC according to claim 2, wherein the reset signal input end is controlled by an inverted signal Clks_inn of an internal sampling control signal Clks_in; the internal sampling control signal Clks_in includes an output signal of the OR gate by inputting an output signal of the N+1th D flip-flop and an external sampling control signal into the OR gate.

4. The high-speed digital logic circuit for SAR_ADC according to claim 1, wherein the reset signal input end is controlled by an inverted signal Clks_inn of an internal sampling control signal Clks_in; the internal sampling control signal Clks_in includes an output signal of the OR gate by inputting an output signal of the N+1th D flip-flop and an external sampling control signal into the OR gate.

5. A sampling adjustment method of a high-speed digital logic circuit for successive-approximation-register analog-to-digital converter (SAR_ADC), wherein the high-speed digital logic circuit for SAR_ADC includes a comparator, a logic control unit parallel to the comparator, and a capacitor array digital-to-analog converter (DAC); wherein the comparator and the logic control unit are simultaneously triggered by a clock signal Clk; the comparator outputs a valid comparison result Dp/Dn, the logic control unit outputs a corresponding rising edge signal C<i>, the corresponding rising edge signal C<i> output by the logic control unit is slightly later than the valid comparison result Dp/Dn output by the comparator through setting a delay match, the valid comparison result Dp/Dn is captured by the corresponding rising edge signal C<i>, thereby settling a capacitor array; i=0, 1, . . . , N−1, N represents a number of bits of SAR_ADC;

wherein the logic control unit comprises an OR gate and N+1 D flip-flops connected in series, and each D flip-flop comprises an AND gate, a pull-up PMOS transistor, a transmission gate and a plurality of inverters; a data signal D<i> enters the transmission gate from a data input end and is transmitted to a first inverter, a reset signal R<i> reverses a signal output from the first inverter at a reset signal input end, and a data signal Q<i> is output through a data output end of a second inverter; the reset signal R<i> and CP<i> in a clock signal Clk at a clock input end CP are output from a third inverter through the AND gate; wherein the N+1 D flip-flops comprise a first D flip-flop, a second D flip-flop, . . . , a Nth D flip-flop and a N+1th D flip-flop;

wherein the method comprises: after N successive approximation processes are completed, an external sampling control signal Clks is still 0, and an output signal generated by the N+1th D flip-flop becomes 1, which makes an output signal of the OR gate become 1, the SAR_ADC immediately enters a sampling state, and the first to Nth D flip-flops are reset at the same time; after the external sampling control signal Clks changes from 0 to 1, the N+1th D flip-flop is reset, the output signal of the N+1th D flip-flop becomes 0, the output signal of the OR gate remains at 1, the SAR_ADC is still in the sampling state until the external sampling control signal becomes 0, the sampling state ends, and the SAR_ADC enters a successive approximation state.

* * * * *